(12) United States Patent
Muller et al.

(10) Patent No.: US 6,534,351 B2
(45) Date of Patent: Mar. 18, 2003

(54) GATE-CONTROLLED, GRADED-EXTENSION DEVICE FOR DEEP SUB-MICRON ULTRA-HIGH-PERFORMANCE DEVICES

(75) Inventors: K. Paul Muller, Wappingers Falls, NY (US); Andre I. Nasr, LagrangeVille, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/811,730

(22) Filed: Mar. 19, 2001

(65) Prior Publication Data

US 2002/0173128 A1 Nov. 21, 2002

(51) Int. Cl.⁷ ............................................ H01L 21/338
(52) U.S. Cl. ...................... 438/182; 438/163; 438/182; 438/574; 438/579; 438/739; 257/336; 257/344
(58) Field of Search .................... 438/42, 389, 182, 438/434, 574–79, 637–640, 163, 739; 257/336, 344

(56) References Cited

U.S. PATENT DOCUMENTS

| | | | |
|---|---|---|---|
| 4,818,714 A | | 4/1989 | Haskell |
| 5,102,815 A | | 4/1992 | Sanchez |
| 5,120,668 A | * | 6/1992 | Hsu et al. ...................... 437/41 |
| 5,168,072 A | | 12/1992 | Moslehi |
| 5,210,435 A | * | 5/1993 | Roth et al. ................... 257/344 |
| 5,270,257 A | | 12/1993 | Shin |
| 5,290,720 A | * | 3/1994 | Chen ............................ 437/41 |
| 5,545,579 A | | 8/1996 | Liang et al. |
| 5,677,210 A | | 10/1997 | Park et al. |
| 5,747,356 A | | 5/1998 | Lee et al. |
| 5,770,507 A | | 6/1998 | Chen et al. |
| 5,783,475 A | | 7/1998 | Ramaswami |
| 5,817,558 A | | 10/1998 | Wu |
| 5,817,562 A | * | 10/1998 | Chang et al. ................. 438/305 |
| 5,891,809 A | * | 4/1999 | Chau et al. ................... 438/770 |
| 5,949,105 A | | 9/1999 | Moslehi |
| 5,989,967 A | | 11/1999 | Gardner et al. |
| 6,004,852 A | | 12/1999 | Yeh et al. |
| 6,159,781 A | * | 12/2000 | Pan et al. ..................... 438/167 |
| 6,287,951 B1 | * | 9/2001 | Lucas et al. .................. 438/618 |

FOREIGN PATENT DOCUMENTS

EP 0-522-991 * 10/1991

OTHER PUBLICATIONS

PFiester, J. "LDD Mosfet's using dispoable sidewall spacer technology" IEEE ElcEt. Device lett. vol. 9 No. 4 p. 189–192.*
Huang et al. "New LDD transistor with Inverse T–gate structure" IEEE Electron Dev. Lett. vol. edl–8 No. 4 4/87 p. 151–153.*
IBM Technical Dislocure, "Method for Forming Laterally Graded FET Junctions," 11,84 pp. 3439–3442.

* cited by examiner

Primary Examiner—Matthew Smith
Assistant Examiner—Granvill D Lee, Jr.
(74) Attorney, Agent, or Firm—Whitham, Curtis & Christofferson, P.C.; Joseph P. Abate

(57) ABSTRACT

A gate-controlled device includes an inverted-T gate which overlaps lightly doped, shallow extension regions formed in an underlying base layer. Spacers are included on the sides of the gate, and source/drain regions are formed in the base layer in non-overlapping relationship with the gate layer. This device outperforms conventional devices in terms of performance. Lower external resistance is achieved by forming a gate-controlled inversion channel over at least a portion of the shallow LDD extensions, and by making the shallow LDD extensions graded (or sloped) towards the deep source/drain regions. Also, forming portions of the gate underneath the spacers, electrical gate control of the shallow LDD junctions is made possible. This advantageously reduces the series resistance of the device and increases drive current, both of which translate into improved device performance with no increase in gate-to-source/drain parasitic capacitance. A method for making the gate-controlled device includes forming the source/drain regions and shallow LDD extensions before deposition of the gate. This advantageously allows high-k dielectrics to be used in the device with reduced temperature stability. Further, the method may be performed in a self-aligned manner, which allows for dopant dose reduction with a commensurate reduction in junction capacitance.

17 Claims, 3 Drawing Sheets

GATE-CONTROLLED, GRADED-EXTENSION DEVICE FOR DEEP SUB-MICRON ULTRA-HIGH-PERFORMANCE DEVICES

BACKGROUND OF THE INVENTION

1. Field of the Invention

This invention generally relates to integrated circuit devices, and more particularly to a field effect transistor with a sub-micron channel length, a lightly doped drain (LDD) structure, and an inverted T-gate interconnect region. The invention is also a method for making a device of this type.

2. Description of the Related Art

Various approaches have been taken to improve the performance of sub-micron, ultra-high-performance devices. One approach, disclosed in U.S. Pat. No. 5,817,558 to Wu, involves forming a T-gate field effect transistor from a lightly doped drain (LDD) structure. An LDD structure is a lightly doped buffer region typically located between a heavily doped drain region and a gate region. Functionally, LDD structures disperse the electric field of the channel and drain region. This, in turn, reduces electric field strength and, commensurately, the generation of high-energy particles, all of which reduce an undesirable phenomenon known as channel hot carrier effect.

Forming the LDD structure mentioned above involves doping low energy phosphorus ions (5~60 KeV) to form an N-region having a concentration of about $5 \times 10^{12}$–$3 \times 10^{15}$ ions/cm$^2$. A recessed groove is then formed using dry etching techniques within the N-region to accommodate a T-shaped gate layer. In carrying out these steps, lithography is often employed to form various mask patterns for various elements of the device. This structure also uses spacers to reduce the effective channel length of the device.

Conventional T-gate field effect transistors using LDD structures have proven to have several drawbacks which adversely affect their performance. For example, the structure disclosed in U.S. Pat. No. 5,817,558 forms source/drain and LDD junctions after spacer and gate formation, which has proven to be inefficient and limiting of effective channel length. This method also involves etching a groove in the substrate which has also proven to be undesirable. Other conventional methods increase series resistance and thus reduce drive current and device performance.

In view of the foregoing considerations, it is clear that there is a need for a gate-controlled device which operates with improved performance compared with conventional devices, and a method for making such an improved device.

SUMMARY OF THE INVENTION

It is an object of the present invention to provide a gate-controlled device which operates with improved performance compared with conventional devices, and moreover one which realizes reduced series resistance and increased drive current without increasing gate-to-source/drain parasitic capacitance.

It is another object of the present invention to provide a method for forming the aforementioned gate-controlled device in the most effective and cost efficient manner possible.

The foregoing and other objects of the invention are achieved by providing a field effect transistor (FET) which includes a base layer, source/drain regions formed in the base layer, and an inverted-T gate layer between the source/drain regions, and shallow LDD extension regions in the base layer. The shallow LDD extension regions are formed in overlapping relationship with the gate layer, but the gate layer and the source/drain regions do not overlap. Furthermore, the shallow LDD extension regions are in contact with the inverted-T gate layer and the source/drain regions. The FET also includes spacers formed on the sides of the inverted-T gate layer. To form the inverted "T," portions of the gate layer project underneath the spacers. Gate insulator layers are formed on the spacers, and CoSi silicide layers are formed on the source/drain regions and a top surface of the inverted-T gate layer.

The FET of the present invention outperforms conventional devices in a number of ways. First, the invention has lower external resistance than conventional devices achieved by providing a gate-controlled inversion channel over at least a portion of the shallow LDD extensions, and by making the shallow LDD extensions graded (or sloped) towards the deep source/drain regions. Also, by etching the gap regions underneath the spacers and then filling these regions with a gate oxide and poly gate interconnect, the invention is able to perform electrical gate control of the shallow LDD junctions. This advantageously reduces the series resistance of the device and increases drive current, both of which translate into improved device performance with no increase in gate-to-source/drain parasitic capacitance.

The FET of the present invention is also able to control overlap capacitance as a result of a hydrofluoric acid vapor etch, and more specifically by controlling the amount of hydrofluoric acid vapor used to perform the etch. The invention also realizes a shorter channel length, higher Idsat (drain current at saturation), and thus better overall performance.

The method for making the field effect transistor (FET) of the present invention includes implanting source/drain regions in a base layer, depositing a first doped oxide layer over the base layer, forming a masking layer over the first doped oxide layer, etching an opening in the first doped oxide layer and the masking layer to expose the base layer, forming a second doped oxide layer in the opening, depositing spacers along side walls of the opening and on top of the second doped oxide layer, and implanting shallow extension regions into the base layer using a light dopant. The shallow extension regions are formed to extend from the source/drain layers to underneath the opening.

The method further includes selectively etching gaps in the second doped oxide layer at a position underneath the spacers and above said lightly doped, shallow extension regions. The opening is then filled along with the gaps to form an inverted-T gate in overlapping relationship with the shallow extension regions, but not overlapping the source/drain regions. CoSi layers are then formed on the base layer over top the source/drain regions and gate.

In performing the method of the present invention, the deep source/drain regions and shallow extensions are completed before deposition of the gate insulator layers. This opens a route to high dielectric constant (k or ∈) dielectrics with reduced temperature stability. The method also controls the formation (length and location) of the shallow extensions independently of the self-aligned silicide locations. As a further advantage, channel implants for threshold voltage ($V_t$) adjustments may be made through a center of the opening using the so-called "blob in the middle" technique, which involves doping by implantation right under the gate. This is made possible by having an opening where the later-to-be-formed gate is going to be. This process may also be performed in a self-aligned manner, which allows for dopant dose reduction, separated from the deep source/drain junctions, resulting in reduced junction capacitance.

DESCRIPTION OF THE PREFERRED EMBODIMENTS

Figure 1:
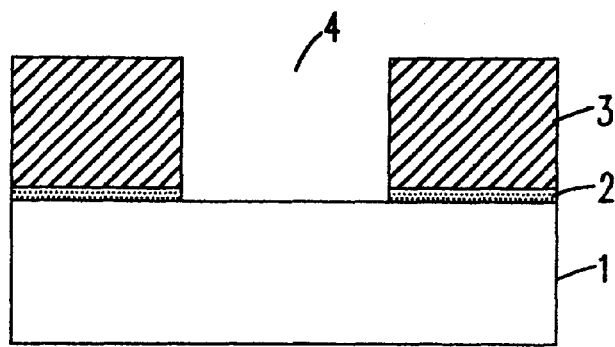
FIG. 1 is diagram showing the formation of a first doped oxide layer and a masking layer on a base layer in accordance with a preferred embodiment of the method of the present invention.

Referring to FIG. 1, an initial step of the method of the present invention includes forming a doped oxide layer 2 on a surface of a base layer 1. The base layer may be a bulk silicon substrate or a silicon-on-insulator (SOI) structure. Preferably, the oxide layer is 10 to 50 nm thick and made of phospho silicate glass (PSG), boro silicate glass (BSG), or arsenic-doped glass (ASG). As far as dopants are concerned, layer 2 may be doped with phosphorus and/or arsenic at a concentration of 1 to 5 atomic %. If layer 2 is BSG, it may be deposited in a high density plasma tool similar to HDP oxide, however in this case an addition of boron (e.g., $B_2H_6$ diborane diluted in argon) into the feed gases ($SiH_4$ and $O_2$) would be required.

After the oxide layer formed on the base layer, it is coated with a masking layer 3, for example, in the form of a nitride film. The nitride film may be 100 to 300 nm thick and formed by conventional techniques, including low-pressure chemical vapor deposition (LPCVD) and plasma enhanced chemical vapor deposition (PECVD).

A second step includes patterning and etching the masking layer and the doped oxide layer to form an opening 4 exposing a surface of the base layer, as also shown in FIG. 1. Reactive ion etching may be used to perform this step.

The patterning and etching may alternatively be performed by spinning a photoresist layer on the wafer. If desired, an undoped oxide layer may be deposited at least on the exposed surface of the base layer to prevent doping contamination of the channel and extension region (discussed in greater detail below) during high temperature annealing. This annealing step may be performed with a standard furnace at 700° C., to 1000° C., in nitrogen or diluted with oxygen for 5 to 30 minutes, or longer if deeper source and drain junctions are required. This step can also be performed using a rapid thermal anneal (RTA, at 800° C. to 1000° C. for 1 to 2 minutes) to diffuse the doping from the oxide region into the silicon wafer. As discussed in subsequent process steps, opening 6 provides a location where a gate of the device will be formed.

Figure 2:
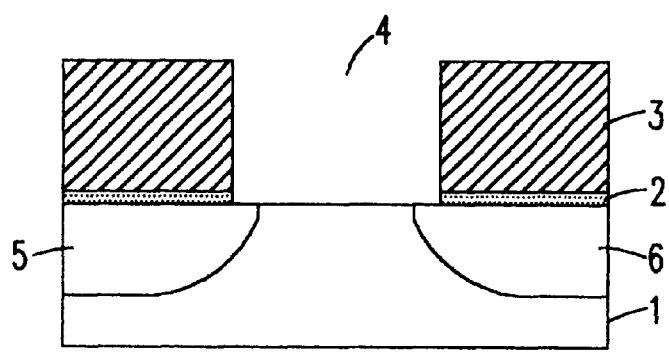
FIG. 2 is a diagram showing the formation of source/drain regions in the base layer.

A third step includes performing a high-temperature anneal to form source/drain regions 5 and 6 in the base layer, as shown in FIG. 2. The conditions for this anneal may be as follows: Rapid thermal anneal at 1050° C. for 30 seconds.

Figure 3:
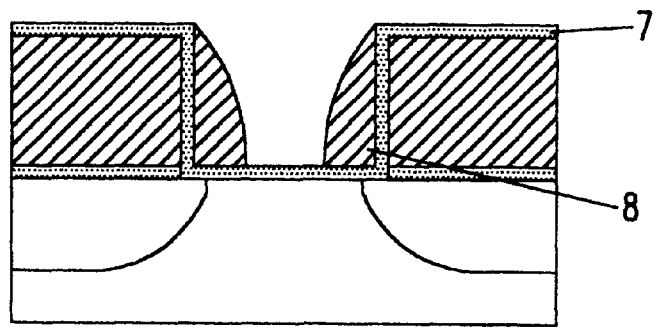
FIG. 3 is a diagram showing the deposition of a second doped oxide layer and spacers within the opening shown in FIG. 2.

A fourth step includes forming a second doped oxide layer 7 over remaining portions of the masking layer and the opening, as shown in FIG. 3. This doped oxide layer may be conformal BSG, PSG, or ASG having a thickness of between 100 and 1000 Å. This layer may be formed using known deposition techniques, such as chemical vapor deposition. As an alternative, to depositing a new second doped oxide layer, the undoped oxide layer mentioned above may be left on the wafer. This undoped layer is then used in conjunction with implant or furnace doping and used as a diffusion source for the extension region, discussed in greater detail below.

Once the oxide layer has been formed over the masking layer and opening, the method continues by depositing spacers 8 of, for example, nitride material along the side walls of the opening. The spacers may be formed using LPCVD or CVD techniques and then shaped by etching to form vertical 10 to 100 nm spacers, as shown in FIG. 3.

Figure 4:
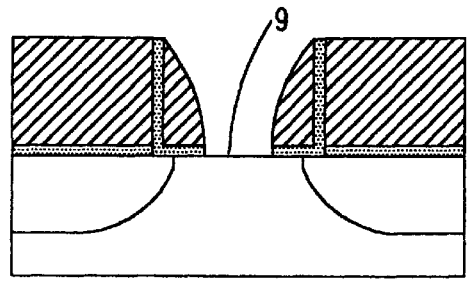
FIG. 4 is a diagram showing the patterning of the opening shown in FIG. 4.

A fifth step includes etching an opening 9 in the second doped oxide layer to expose the surface of the base layer at the bottom of the opening 6, as shown in FIG. 4.

Figure 5:
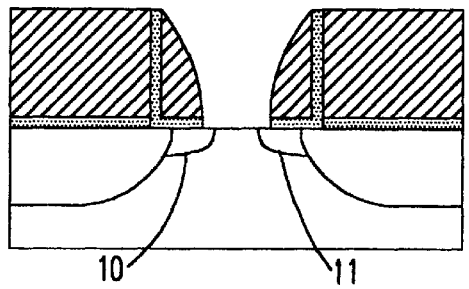
FIG. 5 is a diagram showing the formation of lightly doped, shallow extension regions in the base layer at a position underlying the opening formed in accordance with the present invention.

A sixth step includes forming lightly doped, shallow extension regions 10 and 11 adjacent the source/drain regions. As shown in FIG. 5, the extensions project underneath the second doped oxide layer and spacers within the gate opening. Preferably, the extensions extend beyond these layers into uncovered portions of the opening along the surface of the base layer. Out diffusion techniques may be used to 2 0 form the shallow extension regions. This involves performing a second anneal (by furnace or RTA at 600 to 1000° C. for 30 seconds to more than 10 minutes) to diffuse the doping from the BSG or PSG oxide into the silicon wafer and form a shallow junction of 10 to 100 nm in depth, as shown in FIG. 5. If BSG is used, the dopant may be boron. If PSG is used, the dopant may be phosphorus. Prior to the anneal step, an undoped oxide film can be deposited to prevent doping contamination into the channel region. Shallow extensions 10 and 11, thus, serve as lightly doped drain (LDD) regions.

Figure 6:
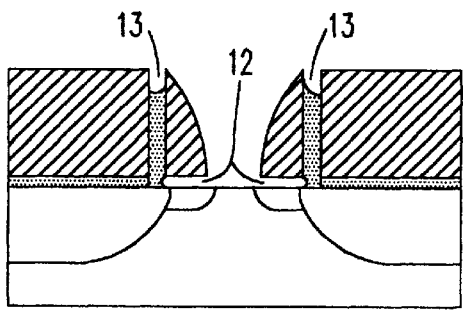
FIG. 6 is a diagram showing a timed vapor etch in the second doped oxide layer used to form gap regions between the spacers and shallow extension regions, and cut-out regions between the spacers and the masking layer in accordance with the present invention.

A seventh step includes selectively removing portions of the second doped oxide layer to form undercut regions (or gaps) 12 between the spacers and the base layer at positions which overlap the LDD shallow extension regions, as shown in FIG. 6. The selective removal of the oxide material is performed by a timed anhydrous HF oxide etch, followed by an in situ rinse. The dimensions of the undercut regions depend on the doped oxide thickness and the nitride spacer width, as well as the selectivity of the vapor etc. An optimal undercut height is 10 to 30 nm and an optimal width W is 10 to 30 nm. (See FIG. 6).

Since the selectivity of oxide to nitride etch rates is very high (6000:1) in this type of vapor HF etch, no nitride spacer erosion has to be taken in to account. An undercut of 10 μm is obtained in a 30 second etch. The control limits are ±1 second resulting in undercut variations of ±0.3 μm meeting the control requirements. An undercut of 30 μm is obtained in 90 seconds with the same control conditions. Also, in FIG. 6 cut-out regions 13 are formed between the spacers and the masking (e.g., nitride) layer. These cut-outs are unavoidable as a result of the vapor etch used to form regions 12.

Figure 7:
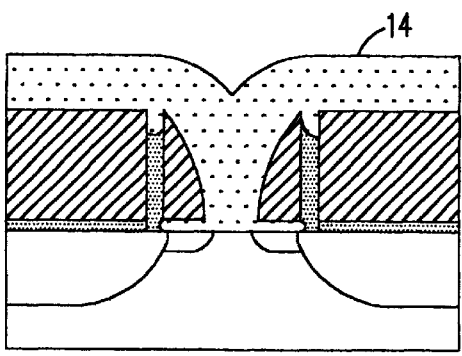
FIG. 7 is a diagram showing the manner in which the opening shown in FIG. 7 is filled with silicon material in order to form the inverted-T gate of the present invention.

An eighth step includes forming a gate (or gate interconnect) within opening 9. This involves a channel implant to adjust the threshold voltage of the device, followed by a gate dielectric formation, followed by formation or deposition of polysilicon or amorphous silicon 14, conformally filling the volume between the spacers 8 and the regions 12 formed under the spacers, as shown in FIG. 7. Any other suitable gate interconnect material may be used including tungsten. The gate dielectric may be formed by any suitable gate oxide material deposition, including high K gate dielectrics such as $La_2O_3$ and $Al_2O_3$. Alternatively, stacked oxide/nitride may be used for the gate dielectric. For nFET, the channel implant may be boron at $1\times10^{12}/cm^2$ at 17.5 keV, and for a pFET, the implant may be phosphorus or arsenic at $1\times10^{12}/cm^2$ at 5 keV to adjust $V_t$ to approximately 250 millivolts. The gate dielectric may be formed as a $SiO_2$ layer using conventional RTO (rapid thermal oxidation) process at 900° C.

This deposition step includes filling the undercut regions 12 with amorphous or polysilicon to thereby form what will become the inverted T-gate of the device, after subsequent patterning and etching steps are performed. The cut-out regions 13 are also filled with the polysilicon or amorphous silicon material, and the masking layers surrounding the opening are also coated with this material.

Figure 8:
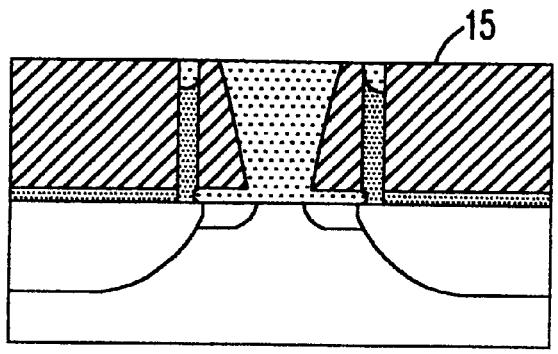
FIG. 8 is a diagram showing steps for planarizing the structure shown in FIG. 7.

An ninth step includes removing the poly or amorphous silicon material back to a level even with the masking layer using, for example, chemical and mechanical polishing (CMP) techniques, to leave a planar top surface 15, as shown in FIG. 8. Here, the nitride from which the masking layer is made acts as a stop to the polishing step. An over etch is also possible to remove the small amount of gate material which was deposited in the space wherein the deposited oxide spacer was vapor etched.

Figure 9:
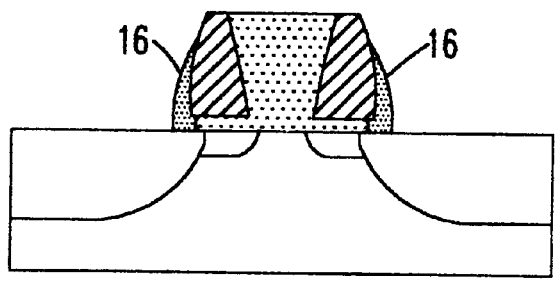
FIG. 9 is a diagram showing etching steps used to remove the masking layer and to shape the second oxide layer of the structure shown in FIG. 9.

A tenth step includes removing the remaining portions of masking layer 5, as shown in FIG. 9, using dry or wet etching techniques. The second doped oxide layer is then etched back to leave only insulator portions 16. The step is controlled to ensure that the oxide layer is not etched through to the poly or amorphous silicon material underneath the spacers. Alternatively, a hot phosphoric wet etch may be used to remove the first nitride spacers. New nitride spacers may then be formed on either side of the inverted-T gate where the old spacers existed.

Figure 10:
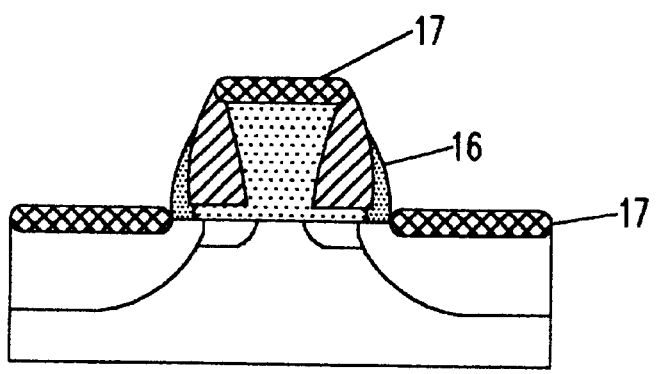
FIG. 10 is a diagram showing the deposition of CoSi salicide layers on the source/drain regions and the gate of the structure shown in FIG. 10.

An eleventh step includes forming silicide layers 17 over the exposed source/drain regions up to the spacers, as well as over the poly or amorphous silicon gate including adjacent portions of the spacers, as shown in FIG. 10. The silicide layers may be formed of cobalt silicon (CoSi) material, which is a material used widely in the industry to lower the sheet rho of the diffusion areas (S/D) and to reduce the contact resistance, i.e., $R_{ext}$ reduction. (Here, $R_{ext}$ is an external resistance equal to resistance from source contact to drain contact, excluding channel resistance). In accordance with one embodiment of the invention, the CoSi material may be formed by Co sputter deposition, a first anneal at 550° C. for 30 seconds for forming CoSi on the silicon and poly silicon surfaces, followed by a wet etch removal of the unreacted Co on all other surfaces, followed by a second anneal at 800° C. for 30 seconds forming the $CoSi_2$ phase. Preferably, the cobalt material is not formed over the insulator portions.

Inclusion of the CoSi silicide layers are preferable for lowering the sheet rho of the source/drain diffusion areas and to reduce contact resistance. These layers may be formed by cobalt sputter deposition, a first anneal at 550° C. for 30 seconds. This results in the formation of CoSi layers on the silicon and polysilicon surfaces. These steps may then be followed by a wet etch removal of the unreacted cobalt on all other surfaces, followed by a second anneal at 800°C. for 30 seconds forming the $CoSi_2$ phase.

The aforementioned process results in the formation of a sub-micron channel length FET with shallow LDD extensions which overlap an inverted T-gate interconnect region. Such a device represents a significant improvement over conventional gate-controlled devices in a number of respects.

First, the FET of the present invention has lower external resistance (defined as the resistance from source contact to drain contact excluding channel resistance) than conventional devices. This is achieved, one, by providing a gate-controlled inversion channel over at least a portion of the shallow LDD extensions, and two, by making the shallow LDD extensions graded (or sloped) towards the deep source/drain regions.

Also, by etching the gap regions underneath the spacers and then filling these regions with a gate oxide and poly gate interconnect, the invention is able to perform electrical gate control of the shallow LDD junctions. This advantageously reduces the series resistance of the device and increases drive current, both of which translate into improved device performance with no increase in gate-to-source/drain parasitic capacitance.

The FET of the present invention is also able to control overlap capacitance as a result of the HF vapor etch, and more specifically by controlling the amount of the HF (hydrofluoric acid) vapor used to perform the etch. This etch may be performed in a commercially available tool (e.g., Excalibur by FSI). With 0% water content in the vapor, the following selectivities can be obtained:

| | |
|---|---|
| BSG: thermally grown oxide | 6000:1 |
| BSG: densified TEOS | 5000:1 |
| BSG: $Si_3N_4$ | infinity (=no measurable nitride each |
| ASG: thermally grown oxide | 5:1 |

By controlling the HF vapor etch in this manner, overlap capacitance may be controlled in accordance with the following relationship: $C_{overlap}=C_X \cdot W$, where W is controlled by the HF vapor etch. Incidentally, if no vapor etch if available, a 5:1 ratio of sulphuric and hydrofluoric acid may be used giving the following selectivities:

| | |
|---|---|
| BSG: thermally grown oxide | 40:1 |
| BSG: densified TEOS | 30:1 |

In forming the FET of the invention, the deep source/drain regions and shallow LDD extensions are completed before deposition of the gate insulator layers. This opens a route to high dielectric constant (k or ∈) dielectrics with reduced temperature stability. Also, very shallow junctions can be obtained by avoiding high-temperature anneals in the integration flow in hand. The FET of the present invention also realizes a shorter channel length, higher Idsat (drain current at saturation), and thus better performance (inbound spacers).

The method of the present invention controls the formation (e.g., length and location) of the shallow LDD extensions independently of the self-aligned silicide locations (through dual spacer). These silicide locations are shown, for example, by reference numeral 17 in FIG. 10. The dual spacers are desirable because they can avoid shorts from the poly to the silicide.

As a further advantage, channel implants for threshold voltage ($V_t$) adjustments may be made through a center of the opening 6. These adjustments may be made using the so-called "blob in the middle" technique, which involves doping by implantation right under the gate. This is made possible by having an opening where the later-to-be-formed gate is going to be. This process may also be performed in a self-aligned manner, which allows for dopant dose reduction, separated from the deep source/drain junctions, resulting in reduced junction capacitance.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention. For example, the method of the present invention may easily be extended to CMOS devices.

We claim:

1. A field-effect transistor (FET), comprising:

a base layer;

source/drain regions in the base layer;

spacers formed above and between the source/drain regions, said spacers being shaped and undercut;

an inverted-T gate layer between the source/drain regions conforming to the shaped spacers and filling the undercut of the spacers; and lightly doped, shallow extension regions in the base layer, said extension regions disposed underneath the inverted-T gate layer and in contact with said inverted-T gate layer and said source/drain regions.

2. The FET of claim 1, further comprising:

gate insulator layers formed on external surfaces of said spacers and extending to said base layer and covering that portion of said inverted-T gate layer filling the undercut of the spacers.

3. The FET of claim 2, further comprising:

CoSi silicide layers formed on the source/drain regions and a top surface of the inverted-T gate layer.

4. The FET of claim 1, further comprising:

a gate-controlled inversion channel over at least a portion of said lightly doped shallow extension regions.

5. The FET of claim 1, wherein said lightly doped, shallow extension regions are graded regions sloped towards said source/drain regions.

6. The FET of claim 1, wherein said gate layer does not overlap said source/drain regions.

7. The FET of claim 1, wherein said inverted-T gate layer is one of polysilicon or amorphous silicon.

8. A method for making a field effect transistor (FET) having an inverted-T gate, comprising:

depositing a first doped oxide layer over a base layer;

forming a masking layer over said first doped oxide layer;

etching an opening in the first doped oxide layer and the masking layer to expose said base layer;

annealing to form source/drain regions in said base layer;

forming a second doped oxide layer in said opening;

depositing spacers along side walls of said opening and on top of said second doped oxide layer;

implanting shallow extension regions into said base layer using a light dopant, said shallow extension regions extending from said source/drain layers and underneath said opening;

selectively etching gaps in said second doped oxide layer at a position undercutting said spacers above said lightly doped, shallow extension regions; and filling said opening and said gaps with silicon material to form an inverted-T gate.

9. The method of claim 8, wherein said first doped oxide layer and said second doped oxide layer are selected from a group consisting of BSG, PSG, and ASG.

10. The method of claim 8, wherein said masking layer includes a nitride layer.

11. The method of claim 8, wherein said step of etching gaps in said second doped oxide layer is performed based on a timed HF vapor etch.

12. The method of claim 8, wherein said silicon material is one of polysilicon or amorphous silicon.

13. The method of claim 8, further comprising:

removing the silicon material back to a level of the masking layer to leave a planar top surface;

removing remaining portions of the masking layer; and etching said second doped oxide layer to leave insulator portions on external surfaces of said spacers which extend to said base layer and cover that portion of said inverted-T gate filling the undercut of the spacers.

14. The method of claim 13, further comprising:

depositing CoSi formations on said base layer over top said source/drain regions and on said gate.

15. The method of claim 8, further comprising:

forming a gate-controlled inversion channel over at least a portion of said lightly doped shallow extension regions.

16. The method of claim 8, wherein said step of implanting lightly doped shallow extension regions includes implanting said shallow extension regions to be graded towards said source/drain regions.

17. The method of claim 8, wherein said gate layer does not overlap said source/drain regions.

* * * * *